(12) United States Patent
Kamins et al.

(10) Patent No.: US 7,609,432 B2
(45) Date of Patent: Oct. 27, 2009

(54) NANOWIRE-BASED DEVICE AND METHOD OF MAKING SAME

(75) Inventors: Theodore I. Kamins, Palo Alto, CA (US); Wei Wu, Palo Alto, CA (US); Shih-Yuan Wang, Palo Alto, CA (US); Shashank Sharma, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 140 days.

(21) Appl. No.: 11/549,283

(22) Filed: Oct. 13, 2006

(65) Prior Publication Data

US 2008/0088899 A1   Apr. 17, 2008

(51) Int. Cl.
*G02B 26/12* (2006.01)
(52) U.S. Cl. .............. 359/223; 257/72; 257/E51.021; 257/E33.067; 977/724; 977/762; 315/111.21; 315/128; 315/149; 313/361.1; 313/231.31

(58) Field of Classification Search .............. 977/762
See application file for complete search history.

(56) References Cited

U.S. PATENT DOCUMENTS

| | | | |
|---|---|---|---|
| 5,883,012 A | 3/1999 | Chiou et al. | |
| 6,525,307 B1 | 2/2003 | Evans, III et al. | |
| 2003/0090190 A1* | 5/2003 | Takai et al. | 313/311 |
| 2004/0240252 A1* | 12/2004 | Pinkerton et al. | 365/151 |
| 2007/0170071 A1* | 7/2007 | Suh et al. | 205/687 |
| 2007/0202673 A1* | 8/2007 | Kim et al. | 438/580 |

\* cited by examiner

*Primary Examiner*—Minh-Loan T Tran
*Assistant Examiner*—Fei Fei Yeung Lopez

(57) ABSTRACT

A nanoelectromechanical (NEM) device and a method of making same employ a laterally extending nanowire. The nanowire is grown in place from a vertical side of a vertically extending support block that is provided on a horizontal surface of a substrate. The nanowire is spaced from the horizontal surface. The NEM device includes a component that is provided to influence the nanowire.

20 Claims, 4 Drawing Sheets

NANOWIRE-BASED DEVICE AND METHOD OF MAKING SAME

STATEMENT REGARDING FEDERALLY SPONSORED RESEARCH OR DEVELOPMENT

N/A

BACKGROUND

1. Technical Field

The invention relates to nanotechnology. In particular, the invention relates to nanowire-based nanoelectromechanical (NEM) devices.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having at least one linear dimension between 1 nm and 200 nm. These nano-scale structures are often 5 to 100 times smaller than conventional semiconductor structures.

A growing area of nanotechnology is nanoelectronics. Nanoelectronics includes nano-scale electronic devices, such as nano-scale field effect transistors (FETs), p-n diodes, light emitting diodes (LEDs) and sensors, to name a few. With respect to electromechanical devices, more interest seems to be focused on state-of-the-art microelectromechanical (MEM) devices than electromechanical devices that incorporate nano-scale structures.

BRIEF SUMMARY

In some embodiments of the present invention, a nanoelectromechanical (NEM) device is provided. The NEM device comprises a support block extending vertically from a horizontal surface of a substrate. The support block has a vertical side. The NEM device further comprises a nanowire extending laterally from the vertical side of the support block. The nanowire is spaced from the horizontal surface of the substrate. The NEM device further comprises a component that influences the nanowire.

In other embodiments of the present invention, a nanoelectromechanical (NEM) device is provided. The NEM device comprises a support block extending vertically from a semiconductor substrate having a horizontal surface. The NEM device further comprises a nanowire extending laterally from a vertical side of the support block. The nanowire is spaced from the surface of the semiconductor substrate. The NEM device further comprises means for influencing the nanowire, such that the nanowire one or more of facilitates light deflection, light generation and an acceleration response.

In other embodiments of the present invention, a method of making a nanoelectromechanical (NEM) device is provided. The method of making comprises providing a support block on a planar substrate having a horizontal surface. The method of making further comprises growing a nanowire from a vertical side of the support block using metal catalyzed growth, such that the nanowire grows laterally from the vertical side. The nanowire is spaced from the horizontal substrate surface. The method of making further comprises providing a component that influences the nanowire.

Certain embodiments of the present invention have other features that are one or both of in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
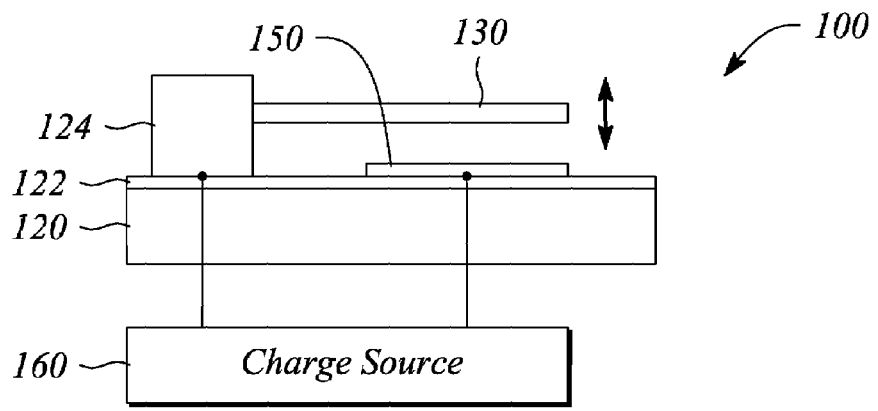
FIG. 1A illustrates a side view of a NEM light deflection device according to an embodiment of the present invention.

A nanoelectromechanical (NEM) device is characterized by comprising a nano-scale structure having feature sizes that are smaller, often by an order of magnitude or more, than a corresponding micro-scale structure found in conventional microelectromechanical (MEM) devices. According to various embodiments of the present invention, the NEM device comprises a nanowire as a nano-scale structure. A nanowire is an individual low dimensional, nano-scale, crystalline structure typically characterized as having two dimensions or directions that are much less than a third dimension or direction. The presence of the third, greater dimension in nanowires facilitates electrical conduction along that dimension.

As used herein, a nanowire is defined as a nano-scale crystalline structure having an axial length (as a major dimension), opposite ends and a solid core that is not a so-called 'nanotube', by definition, at least since a nanotube has a hollow core.

Moreover, according to the various embodiments of the present invention, a nanowire is further defined herein as a nano-scale crystalline structure that is grown in place from a surface of the NEM device using catalyzed growth techniques. By definition, 'grown in place' means that one of the ends of the nanowire originates as being connected to the surface (i.e., is inherently connected) during growth while the other end is free from that surface during growth. In other words, the nanowire is intrinsically anchored at one end during growth by the catalyzed growth process and extends in a predominately perpendicular direction from the surface.

Nanowires are grown using a variety of techniques. For example, catalyzed growth includes, but is not limited to, metal-catalyzed growth using one or more of a vapor-liquid-solid VLS technique and a vapor-solid VS technique, for example. A nanoparticle catalyst is formed on a surface from which the nanowire is to be grown. The growth may be performed in a chemical vapor deposition (CVD) chamber, for example, using a gas mixture comprising precursor nanowire materials and the assistance of the nanoparticle catalyst. In particular, the nanoparticle catalyst accelerates decomposition of the precursor nanowire material in the gas mixture, such that adatoms resulting from decomposition of a particular nanowire material-containing gas diffuse through or around the nanoparticle catalyst, and the adatoms precipitate on the underlying substrate. The adatoms of the nanowire material precipitate between the nanoparticle catalyst and the surface to initiate nanowire growth. Moreover, catalyzed growth of the nanowire is continued with continued precipitation at the nanoparticle-nanowire interface. Such continued precipitation causes the nanoparticle to remain at the tip of the free end of the growing nanowire. The nanowire growth is continued until a targeted nanowire length is achieved. Other techniques, such as laser ablation for example, also may be used to supply the material forming the growing nanowire.

During catalytic growth, nanowires grow from the location of the nanoparticle catalyst in a predominately perpendicular direction to a plane of a suitably oriented substrate surface. Under the most common growth conditions, nanowires grow in <111> directions with respect to a crystal lattice and therefore, grow predominately perpendicular to a (111) surface (of a crystal lattice). For (111)-oriented horizontal surfaces, a nanowire will grow predominately vertically relative to the horizontal surface. On (111)-oriented vertical surfaces, a nanowire will grow predominately laterally (i.e., horizontally) relative to the vertical surface.

In some embodiments of the present invention, a NEM device is provided. The NEM device comprises a support block extending vertically from a substrate. The substrate has a major surface that is horizontal relative to the vertically extending support block. The support block has vertical sides and a top. In some embodiments, the support block may be referred to as a plate or an electrode. The NEM device further comprises a nanowire that extends laterally from and perpendicular to a vertical side of the support block. The nanowire is a grown-in-place nanowire using catalytic growth, as defined above. The laterally extending nanowire is spaced from the major surface of the substrate from which the support block vertically extends. The NEM device further comprises a component that influences the nanowire. The component includes, but is not limited to, an electrode, a charge source, a voltage source, a proof mass and other means for influencing the nanowire. When the nanowire is influenced by the component, the nanowire facilitates one or more of an acceleration response, light deflection and light generation.

Figure 1B:
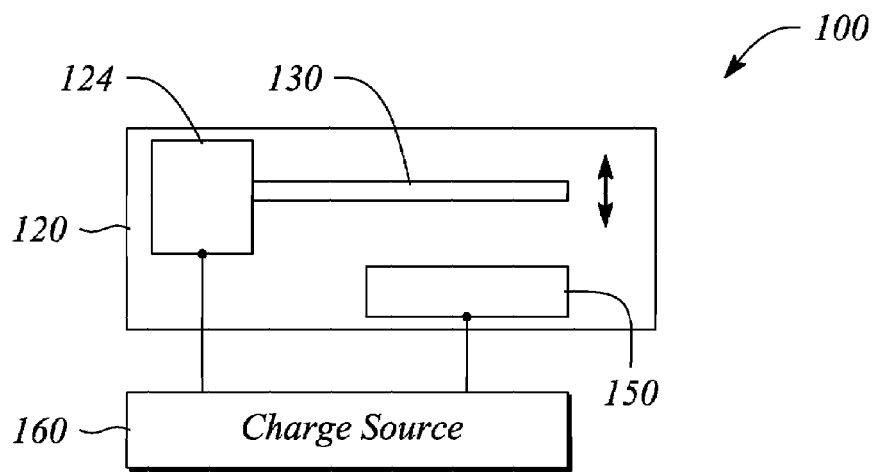
FIG. 1B illustrates a top view of a NEM light deflection device according to another embodiment of the present invention.

FIG. 1A illustrates a side view of a NEM light deflection device 100 according to an embodiment of the present invention. FIG. 1B illustrates a top view of a NEM light deflection device 100 according to another embodiment of the present invention. The NEM light deflection device 100 comprises a support electrode 124 extending vertically from a substrate 120 having a major horizontal surface. The support electrode 124 is exemplary of the support block mentioned above that is rendered electrically conductive in these embodiments. The NEM light deflection device 100 further comprises a nanowire 130 grown in place from a vertical side of the support electrode 124 in a horizontal or lateral direction. The nanowire 130 is suspended above the major horizontal surface of the substrate 120. The NEM light deflection device 100 further comprises a control electrode 150 in proximity to the nanowire 130.

In some embodiments, the control electrode 150 is located on the substrate 120 underneath the nanowire, as illustrated in FIG. 1A. In other embodiments, the control electrode 150 is located on the substrate 120 adjacent to a side of the nanowire 130, as illustrated in FIG. 1B. In the embodiments illustrated in FIGS. 1A and 1B, the nanowire 130 cantilevers from the vertical side of the support electrode 124.

Figure 1C:
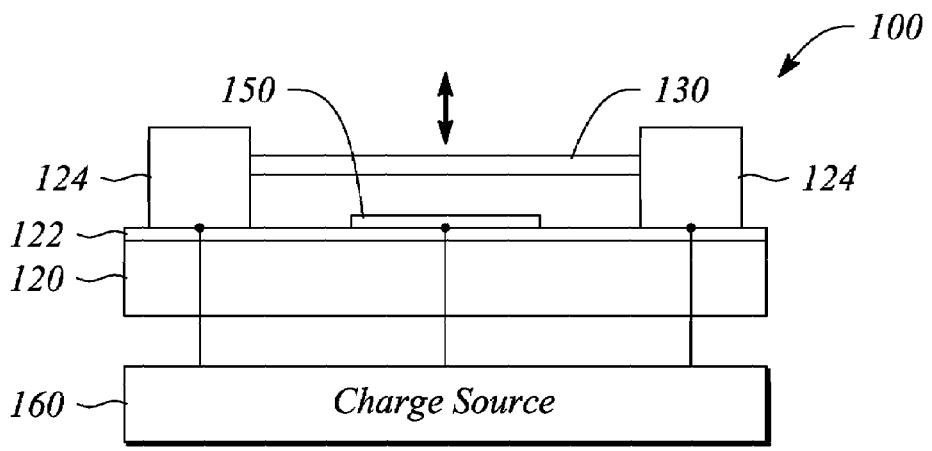
FIG. 1C illustrates a side view of a NEM light deflection device according to another embodiment of the present invention.

FIG. 1C illustrates a side view of a NEM light deflection device 100 according to another embodiment of the present invention. In the embodiment illustrated in FIG. 1C, the NEM light deflection device 100 further comprises a second support electrode 124 that extends vertically from the substrate 120 in the same way as the first-mentioned support electrode 124. Moreover, the nanowire 130 bridges and is suspended between the two support electrodes 124 instead of cantilevering from one support electrode 124. In some embodiments, an insulator layer 122 is on the surface of the substrate 120 and electrically isolates the electrodes 124, 150 from one another and from the substrate. The insulator layer 122 is illustrated in FIGS. 1A and 1C by way of example. In other embodiments, other means for providing electrical isolation between the electrodes 124, 150 is used instead of the insulator layer 122. For example, the material of the substrate 120 may be an insulator. The illustration in FIG. 1B is considered representative of the NEM device 100 without the insulator layer 122 by way of example.

When a charge differential is created between the nanowire 130 and the control electrode 150, the nanowire 130 will move either toward or away from the control electrode 150, depending on the charge on the nanowire 130 and the charge on the control electrode 150. Each of FIGS. 1A-1C illustrates a double-headed arrow that exemplifies the direction of movement of the nanowire 130 relative to the location of the control electrode 150. The NEM light deflection device 100 further comprises a charge source 160 in electrical communication with the control electrode 150 and the support electrode(s) 124 to establish the charges thereon. The charge source 160 in communication with the support electrode(s) 124 and the control electrode 150 is further illustrated in FIGS. 1A-1C according to various embodiments of the present invention. In some embodiments, the charge source 160 is the component that influences the nanowire mentioned above. In some embodiments, the charge source 160 and the electrodes 124, 150 are components that influence the nanowire.

In some embodiments, when no charge is applied, light entering an aperture of the NEM light deflection device 100 is transmitted through or reflected back out of the aperture, such that a light output of the NEM device 100 has a first intensity that is a maximum. In these embodiments, the nanowire 130 is in an unbiased, neutral position. Moreover, the nanowire 130 is reflective, such that the light is reflected off the nanowire 130 at an unbiased angle. In some embodiments, when a charge is applied, the nanowire 130 is deflected either toward or away from the control electrode 150 to varying degrees, such that the nanowire 130 reflects the light at biased angles that are different from the unbiased angle. The amount of charge applied to one or both of the nanowire 130 and the control electrode 150 from the charge source 160 affects the degree of deflection of the nanowire 130. For example, in some embodiments, the degree of deflection is such that there is effectively no light output from the NEM device 100. As such, the intensity of the light output of the NEM light deflection device 100 can be controlled between a maximum and zero.

The different angles of reflection change the amount of light passing through the aperture of the NEM device 100, which in turn affects the light intensity. As such, the NEM light deflection device 100 provides a variety of light output intensities depending on a degree of deflection of the nanowire 130.

In some embodiments, the NEM light deflection device 100 further comprises a reflective coating (not illustrated) on one or both of a surface of the substrate 120 and the nanowire 130. In these embodiments, the reflective coating facilitates directing reflected light toward the aperture of the NEM light deflection device 100. For example, the reflective coating increases the amount of light reflecting from at least the nanowire 130 in the NEM device 100. The reflective coating material includes, but is not limited to, aluminum (Al), gold (Au) and silver (Ag).

The NEM light deflection device 100 has many applications, for example applications where controlling light intensity is useful. For example, the NEM light deflection device 100 may be used in a display system that comprises an array of pixels and control electronics. A pixel comprises one or more of the NEM light deflection devices 100. The display system uses the control electronics to address the pixels either individually or in a variety of combinations. When a pixel is activated, the control electronics direct the charge source 160 to apply a charge to one or both of the control electrode 150 and the nanowire 130 of the NEM light deflection device 100 in the pixel.

Figure 2A:
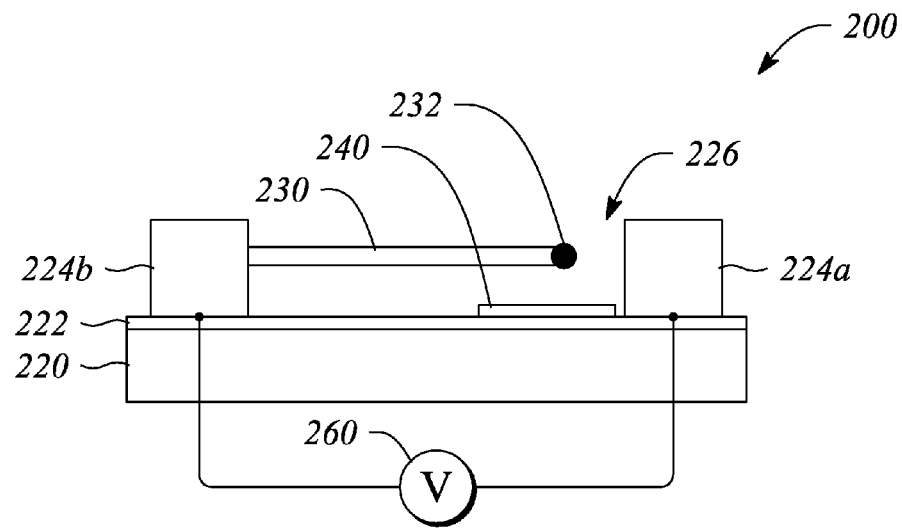
FIG. 2A illustrates a side view of a NEM light generation device according to an embodiment of the present invention.
Figure 2B:
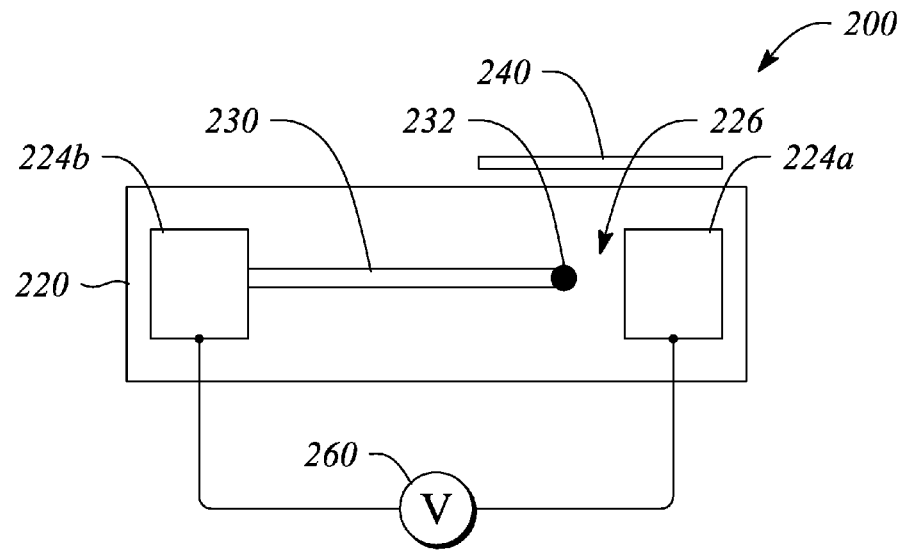
FIG. 2B illustrates a top view of a NEM light generation device according to another embodiment of the present invention.

FIG. 2A illustrates a side view of a NEM light generation device 200 according to an embodiment of the present invention. FIG. 2B illustrates a top view of the NEM light generation device 200 according to another embodiment of the present invention. The NEM light generation device 200 comprises a pair of electrodes 224a, 224b that are spaced apart and extend vertically from a substrate 220 having a major horizontal surface. The NEM light generation device 200 further comprises a nanowire 230 grown in place from a vertical side of a second electrode 224b of the pair in a horizontal or lateral direction toward a first electrode 224a of the pair. The second electrode 224b essentially is the support block mentioned above that is rendered electrically conductive. The first electrode 224a is an additional support block that is also rendered electrically conductive. The nanowire 230 cantilevers above the major horizontal surface of the substrate 220. A free end of the nanowire 230 is spaced from the first electrode 224a, such that a gap 226 is created between the free end of the nanowire 230 and the first electrode 224a.

In some embodiments, an insulator layer 222 is on the surface of the substrate 220 and electrically isolates the electrodes 224a, 224b from one another and the substrate 220. The insulator layer 222 is illustrated in FIG. 2A by way of example. In other embodiments, other means for providing electrical isolation between the electrodes 224a, 224b is used instead of the insulator layer 222. For example, the material of the substrate 220 may be an insulator. The illustration in FIG. 2B is representative of the NEM device 200 without the insulator layer 222 by way of example.

The nanowire 230 comprises a nanoparticle 232 on the free end of the nanowire. In some embodiments, the nanoparticle 232 is a nucleating nanoparticle catalyst that was used to catalyze the growth of the nanowire 230 from the vertical side of the second electrode 224b, as further described below. In other embodiments, the nanoparticle 232 is the nucleating nanoparticle catalyst with a coating that enhances the nanoparticle 232. The NEM light generation device 200 further comprises a voltage source 260 in electrical communication with the pair of electrodes 224a, 224b. In some embodiments, the voltage source 260 is the component that influences the nanowire. In some embodiments, the voltage source 260 and the pair of electrodes 224a, 224b are components that influence the nanowire.

In order for the NEM device 200 to generate light, a voltage is applied to the pair of electrodes 224a, 224b until a voltage between the nanoparticle 232 on the free end of the nanowire 230 and the first electrode 224a exceeds a breakdown voltage of the gap 226. When the breakdown voltage of the gap is exceeded, an electrical discharge or arc bridges the gap and generates a plasma in the gap 226. The generated plasma provides a light output from the NEM light generation device 200. The nanoparticle 232 on the free end of the nanowire 230 facilitates plasma generation in the gap 226.

The nanoparticle 232 is an emitter electrode material that facilitates plasma generation. Efficient materials for plasma generation may or may not have good resistance to erosion, which is a consequence of plasma generation. The less resistance to erosion, the shorter the life of the NEM device 200, unless the nanoparticle 232 can be reworked. Therefore, selection of an emitter electrode material for the nanoparticle 232 may include a trade-off between good emission characteristics and resistance to erosion. Nanoparticle materials that have different degrees of resistance to erosion and damage while providing efficient electron emission at the gap 226 include, but are not limited to, some noble metals and some non-noble metals. For example, gold, gold coated with tungsten (W), titanium (Ti), and titanium oxide, would be an effective nanoparticle material for an emitter electrode application in some embodiments. These and other nanoparticle materials are described below with reference to metal-catalyzed nanowire growth.

In some embodiments, the NEM light generation device 200 further comprises means 240 for enhancing a light output from the NEM device 200 in proximity to the gap 226. In these embodiments, the means 240 for enhancing a light output one or more of reflects, directs and concentrates the generated plasma light toward an aperture of the NEM device 200. As such, the means 240 for enhancing a light output include within their scope, but are not limited to, one or more of a reflective coating, a lens, a mirror and a magnifier. The location of the means 240 for enhancing depends on the geometry of light reflection in the NEM device 200 and is discernible without undue experimentation to facilitate the light output of the NEM device 200.

FIG. 2A illustrates the means 240 for enhancing located on the surface of the substrate 220 underneath the location of the gap 226, by way of example only. FIG. 2B illustrates the means 240 for enhancing a light output located on or external to the substrate 220 generally to a side of the substrate 220 in proximity to the gap 226, for example only. In some embodiments, the goal is to provide as much of the plasma light generated in the gap 226 as the light output at the aperture of the NEM light generation device 200 that the geometry of the NEM device 200 will allow.

The NEM light generation device 200 has many applications where light generation is useful. For example, the NEM light generation device 200 may be used in a light display system that comprises an array of pixels and control electronics. A pixel comprises one or more of the NEM light generation devices 200. The control electronics address the pixels individually or in a variety of combinations. The display system uses the control electronics to activate a pixel. When a pixel is activated, the control electronics direct the voltage source 260 to apply a voltage to the pair of electrodes 224a, 224b of one or more of the NEM light generation devices 200 in that pixel, such that a plasma light is generated, as described above. The generated plasma light is the light output from the activated pixel.

In some embodiments, the display system comprises means for enhancing a light output of the NEM device 200 either in addition to or in lieu of the means 240 for enhancing described above for the NEM device 200. In some embodiments, the means for enhancing in the display system also include, but are not limited to, a reflective coating, a mirror, a lens and a magnifier. In some embodiments, the display system uses the means for enhancing to maximize the plasma light collected from the pixel.

Figure 3A:
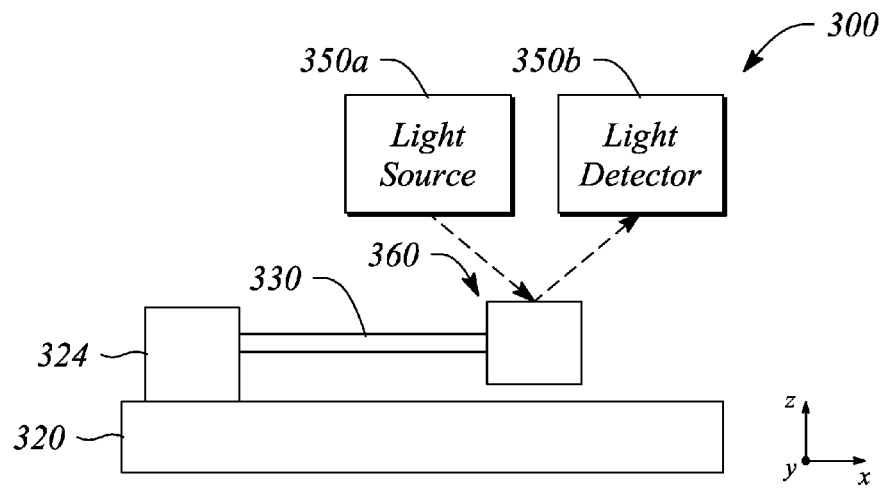
FIG. 3A illustrates a side view of a NEM accelerometer device according to an embodiment of the present invention.
Figure 3B:
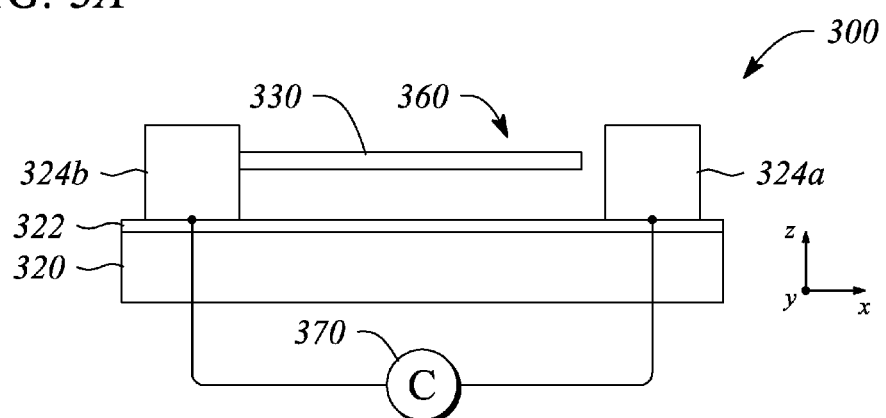
FIG. 3B illustrates a side view of a NEM accelerometer device according to another embodiment of the present invention.
Figure 3C:
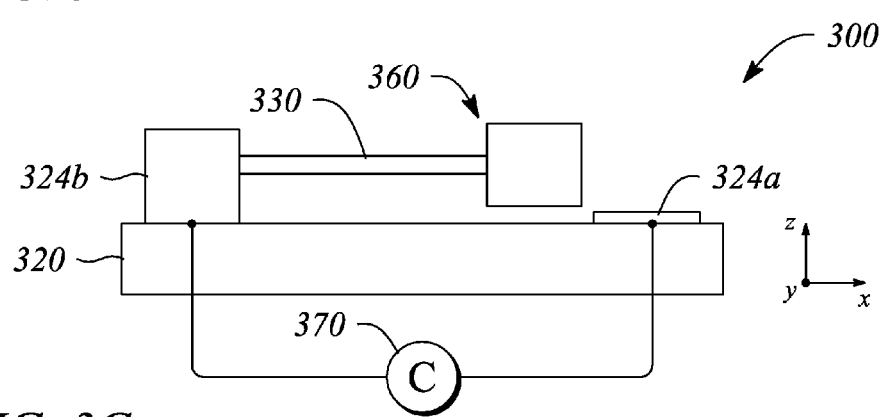
FIG. 3C illustrates a side view of a NEM accelerometer device according to another embodiment of the present invention.

FIG. 3A illustrates a side view of a NEM accelerometer device 300 according to an embodiment of the present invention. FIGS. 3B and 3C illustrate side views of the NEM accelerometer device 300 according to other embodiments of the present invention. Referring to FIG. 3A, the NEM accelerometer device 300 comprises a support block 324 that extends vertically from a horizontal surface of a substrate 320. The NEM accelerometer device 300 further comprises a nanowire 330 grown in place from a vertical side of the support block 324 to extend laterally and cantilever above the substrate 320. The support block 324 is equivalent to the support block mentioned generally above and need not be rendered electrically conductive in the embodiment illustrated in FIG. 3A. The NEM accelerometer device 300 further comprises a proof mass 360. A 'proof mass' is defined herein as a mass 360 associated with an end portion of the nanowire 330. As further defined herein, the proof mass 360 is a portion of the nanowire itself adjacent to the free end. As such, the nanowire 330 itself effectively is a self-influencing component of the NEM accelerometer device 300 by virtue of its mass. In some embodiments, the proof mass 360 is further defined as comprising a mass block suspended from the free end of the nanowire 330. In some embodiments, the proof mass 360 is the component that influences the nanowire of the NEM accelerometer device 300.

The proof mass 360 facilitates sensitivity to acceleration to which the nanowire 330 and the proof mass 360 respond. As such, the proof mass 360 may add to a mass moment of inertia of the nanowire 330 that is responsive to acceleration for the NEM accelerometer device 300. For example, the proof mass 360 will move one or both of up and down (z-direction) and in and out of the plane of the page (y-direction) in response to acceleration, according to the various embodiments described herein, as defined by a Cartesian coordinate system illustrated in FIGS. 3A-3C. Movement of the proof mass 360 in response to acceleration is detectable one or both of capacitively and optically, as further described below.

FIG. 3A illustrates the NEM accelerometer device 300 embodiment that includes means for optically detecting acceleration. The means for optically detecting acceleration comprises a light source 350a focused on the proof mass 360 and a light detector 350b spaced from the light source 350a. One or both of the light source 350a and the light detector 350b are external to the substrate 320, but may be attached to the substrate 320 in some embodiments (not illustrated). A beam of light from the light source 350a is directed onto the proof mass 360. Unless the proof mass 360 moves, the light beam remains constant. However, when the NEM accelerometer device 300 experiences acceleration, the proof mass 360 moves accordingly and the light beam is changed by the responsive movement. The change in the light beam is detected by the light detector 350b. In some embodiments, the detector 350b comprises an array of light detectors to sense changes in position of the light beam.

In some embodiments, the proof mass 360 is reflective, such that the light beam is reflected. As such, the nanowire 330 and in some embodiments, the mass block portion of the proof mass 360 are either made of an inherently reflective material or comprises a reflective coating, such as any of the reflective coating materials mentioned above for the NEM device 100. FIG. 3A further illustrates the light source 350a and the light detector 350b external to the substrate 320, according to an embodiment of the present invention, wherein the dashed-line arrows indicate one example of a light beam that is specifically reflected off the mass block portion of the proof mass 360 by way of example. In some embodiments, the light beam is reflected off the nanowire 330.

In an example, the proof mass 360 reflects the light beam into the light detector 350b when in a stationary position. However, when the NEM accelerometer device 300 experiences acceleration, the proof mass 360 moves accordingly, such that the reflected light beam is interrupted and the light detector 350b no longer detects the light beam. The light beam remains interrupted until the proof mass 360 returns to the stationary position.

In another example, the proof mass 360 moves a small amount during the acceleration, such that only a portion of the light beam is no longer intercepted by the detector 350b. A magnitude of the light beam (i.e., signal) detected by the detector 350b decreases (due to the non-intercepted portion). As such, the magnitude of the detected signal can be varied to sense one or both of a magnitude of the acceleration and a threshold value of the acceleration. In still another example, the detector 350b comprises an array of individual spatially arranged detectors (not illustrated) that collectively render the detector 350b sensitive to a position of the reflected light beam. In this example, the light beam can be deflected from one set of the detectors of the array to another set of the detectors of the array (e.g., a 'set' equals one or more detectors). Such movement of the light beam from one area of the detector array to another provides another means for sensing the magnitude of the acceleration, as well as sensing a threshold value of the acceleration. A single, position-sensitive detector may be used instead of an array of detectors in some embodiments.

In another example, the proof mass 360 blocks the light beam from detection by the light detector 350b when the proof mass 360 is in a stationary position. However, when the NEM accelerometer device 300 experiences acceleration, the proof mass 360 moves accordingly, such that the light beam is no longer blocked by the proof mass 360. The light detector 350b detects the magnitude and the presence of the light beam until the proof mass 360 returns to the stationary position. These and other such examples are within the scope of the present invention.

FIGS. 3B and 3C illustrate the NEM accelerometer device 300 that includes capacitance detection of acceleration. In some embodiments, the NEM accelerometer device 300 further comprises a first electrode 324a spaced from the proof mass 360 by a distance. In these embodiments, the support block 324 comprises a second electrode 324b. Each of the first and second electrodes 324a, 324b, the nanowire 330 and the proof mass 360 are rendered electrically conductive in these embodiments. In some embodiments, an insulator layer 322 is on the surface of the substrate 320 and electrically isolates the electrodes 324a, 324b from one another and from the substrate 320. The insulator layer 322 is illustrated in FIG. 3B by way of example. In other embodiments, other means for providing electrical isolation between the electrodes 324a, 324b is used instead of the insulator layer 322. For example, the material of the substrate 320 may be an insulator. FIG. 3C illustrates the NEM device 300 without the insulator layer 322 by way of example.

Further in FIG. 3B, the proof mass 360 is illustrated as the end portion of the nanowire 330, as defined above. In FIG. 3C, the proof mass 360 is illustrated as further comprising the mass block suspended from the free end of the nanowire 330, as further defined above. The first electrode 324a and the proof mass 360 form a capacitor. A capacitance of the capacitor is inversely proportional to an 'effective' distance between the first electrode 324a and the proof mass 360. The 'effective' distance accounts for contributions of all points on respective surfaces by integrating over a respective surface area of the first electrode 324a and the proof mass 360 in a well-known manner. Therefore, movement of the proof mass 360 changes the capacitance of the capacitor. The capacitance can be measured by probing the electrodes 324a, 324b with a capacitance meter 370, for example. The location and shape of the first electrode 324a relative to the proof mass 360 affect the effective distance (space) between the first electrode 324a and the proof mass 360 and therefore, the capacitance of the capacitor. The first electrode 324a may be formed on the substrate 320 using a shape and location that enhances the capacitance for measurement of acceleration or facilitates the measurement thereof using the capacitance meter 370.

In the embodiment illustrated in FIG. 3B, the first electrode 324a and the second electrode 324b extend vertically from the horizontal surface of the substrate 320, each in much that same way as described above for the support block 324 illustrated in FIG. 3A. At least a portion of each of the support blocks 324 is rendered electrically conductive to support the respective first electrode 324a and the second electrode 324b. In the embodiment illustrated in FIG. 3C, the first electrode 324a is a predominately horizontal pad on the substrate 320 compared to the first electrode 324a in FIG. 3B, while the second electrode 324b is equivalent in FIGS. 3B and 3C. The first electrode 324a in FIG. 3C may be subdivided into a number of regions for added sensitivity of detection. The embodiments illustrated in FIGS. 3B and 3C are exemplary of the many arrangements of the first electrode 324a and the second electrode 324b that are possible and that are within the scope of the present invention.

Figure 4:
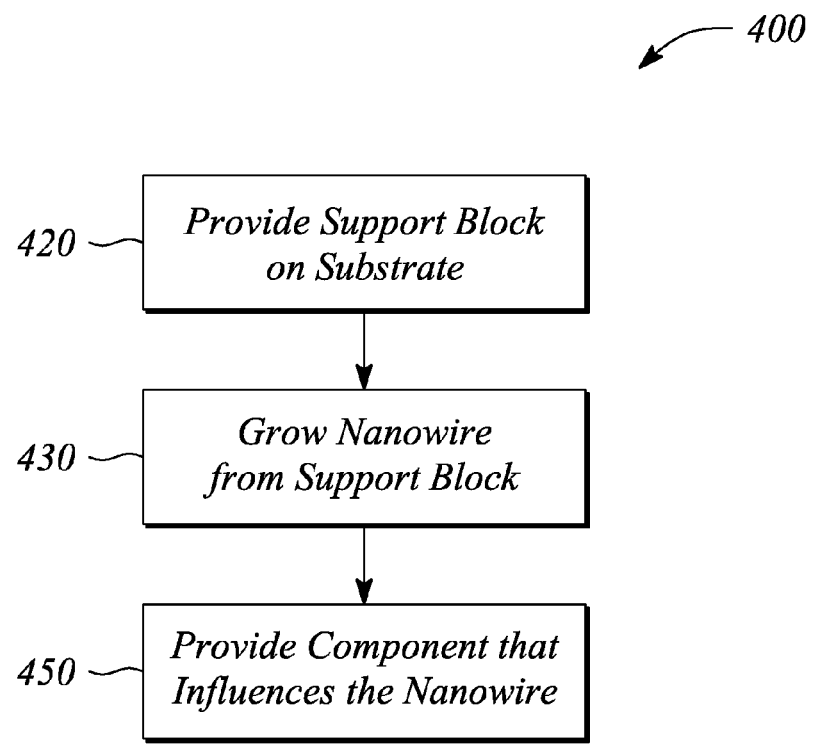
FIG. 4 illustrates a block diagram of a method of making a NEM device according to an embodiment of the present invention.

FIG. 4 illustrates a flow chart of a method 400 of making a NEM device according to an embodiment of the present invention. The method 400 comprises providing 420 a support block on a substrate having a horizontal surface. The method 400 further comprises growing 430 a nanowire from a vertical side of the support block using a catalyzed growth technique. The nanowire grows in place perpendicular to and laterally from the vertical side of the support block as described above. Further, the nanowire is suspended above or spaced from the horizontal surface of the substrate both during and after catalyzed growth. The method 400 further comprises providing 450 a component that influences the nanowire. Depending on the embodiment of the NEM device being made according to the method 400, the component includes, but is not limited to, one or more of a proof mass, as defined above, an electrode, a charge source and a voltage source or other means for influencing.

The substrate used to make 400 the NEM device includes, but is not limited to, a semiconductor wafer, a semiconductor-on-insulator wafer, or a semiconductor-on-sapphire wafer. The semiconductor-on-insulator wafer may incorporate an insulating layer separating a semiconductor layer from a semiconductor wafer. The semiconductor material of the wafer or layer includes, but is not limited to, silicon (Si), germanium (Ge), gallium arsenide (GaAs) and indium phosphide (InP). In some embodiments, the semiconductor layer has a (110) crystal orientation, which means that a major horizontal surface of the substrate is a (110) lattice plane and the substrate comprises a plurality of vertical (111) lattice planes that intersects with the horizontal (110) lattice plane.

Providing 420 a support block on a substrate comprises forming a vertical side of the support block in the horizontal surface of the substrate. The support block is formed with a vertical side using techniques of masking and etching of the semiconductor layer including, but not limited to, photolithography, nano-imprint lithography (NIL), wet chemical etching and dry etching. In some embodiments, providing 420 a support block comprises forming the vertical side along a vertical (111) lattice plane of the (110) semiconductor layer. In some embodiments, the provided 420 support block essentially is the support block 324 of the NEM accelerometer device 300 of FIG. 3A.

In some embodiments of the method 400, providing 420 a support block comprises forming more than one support block. In these embodiments, the support blocks are usually formed at the same time for fabrication efficiency in accordance with the masking and etching techniques mentioned above.

In some embodiments, providing 420 a support block further comprises rendering the support block electrically conductive to form an electrode. In some embodiments, one or more of the formed support blocks is rendered electrical conductive using doping techniques, for example, to form an electrode from the support block(s). In some embodiments, the electrode formed from the support block is equivalent to one or more of the support electrode(s) 124 of the NEM light deflection device 100; the pair of electrodes 224a, 224b of the NEM light generation device 200; and with respect to at least the NEM accelerometer device 300 of FIG. 3B, the electrodes 324a, 324b, and with respect to FIG. 3C, the electrode 324b, for example.

In growing 430 a nanowire from the vertical side of the support block using catalyzed growth, a nanoparticle catalyst is selectively formed on the vertical side using one or more techniques including, but not limited to, angled deposition (e.g., using electron-beam evaporation), electrochemical deposition and chemical vapor deposition, which deposits catalyst material on the vertical side of the support block. In some embodiments, the deposited catalyst material is annealed, such that the catalyst material one or more of changes shape (e.g., a layer pulled into nanoparticles by surface tension), is activated and becomes a nucleating catalyst on the vertical side of the support block. In other embodiments, the nanoparticle catalyst is deposited in an activated, nucleating form and therefore, annealing is optional. For example, annealing removes any surface contaminates that may be present on the surfaces of the substrate.

Typical catalyst materials are metals and nonmetals. Metal catalyst materials include, but are not limited to, gold (Au), titanium (Ti), platinum (Pt), nickel (Ni), tungsten (W), gallium (Ga), and alloys thereof. Nonmetal catalyst materials include, but are not limited to, silicon oxide ($SiO_x$), where x ranges from about 1 to less than 2, for example. Typical nanoparticle catalysts corresponding to Ti and Au catalyst materials used with a silicon surface, for example, are respectively $TiSi_2$ and Au—Si alloy. In some embodiments, the nanoparticle 232 emitter electrode material on the free end of the nanowire 230 of the NEM light generation device 200 comprises one or more of these nanoparticle catalysts.

Nanowire growth 430 is initiated from a location on the vertical side of the support block where the nanoparticle catalyst was formed. For example, the substrate is placed in a chemical vapor deposition (CVD) chamber with a controlled environment. A combination of the nanoparticle catalyst and a gas mixture comprising precursor nanowire materials in the controlled environment facilitates catalyzed nanowire growth 430 as described above. The nanowire will grow 430 in place from the location of the nanoparticle catalyst. The nanowire grows 430 predominately perpendicular to the plane of the vertical side of the support block and cantilevers above the substrate surface during and after growth 430. The nanoparticle catalyst remains on the free end of the nanowire during and after growth 430. In some embodiments, the nanowire is rendered electrically conductive by doping the nanowire during growth 430. In other embodiments, the nanowire is rendered electrically conductive by doping after growth 430. In some embodiments, the nanowire is rendered electrically conductive at the same time that the support block is rendered electrically conductive by doping, for example.

The nanowire growth 430 is continued until a targeted nanowire length is achieved. In some embodiments, the targeted nanowire length is achieved when the free end of the nanowire is spaced from another formed support block by a targeted distance, such that a gap is left between the free end of the nanowire and the other support block. For example, the nanowire 230 of the NEM light generation device 200 and in some embodiments, the nanowire 330 of the NEM accelerometer device 300, are grown 430 until a gap is left between the free end and the first electrode 224a or 324a, respectively. In other embodiments, the targeted nanowire length is achieved when the free end of the nanowire impinges and connects to the other formed support block. For example, in some embodiments of the NEM light deflection device 100 and in some embodiments of the NEM accelerometer device 300, the respective nanowires 130, 330 are grown 430 until the free end of the nanowire 130, 330 impinges on the other support electrode 124 or the support block that forms the mass block portion of the proof mass 360, respectively.

In some embodiments, the nanowire material is the same as the semiconductor material of the support block. For example, a silicon nanowire is grown 430 from a silicon support block or a germanium nanowire is grown 430 from a germanium support block. In other embodiments, the nanowire material and the support block material are different to independently optimize the properties of the support block and the nanowire including, but not limited to, one or more of their electrical properties, mechanical properties and optical properties. For example, the support block may be silicon to be compatible with well established silicon integrated-circuit technology and be compatible with an underlying silicon substrate, and the nanowire may be a different semiconductor material chosen to optimize its optical, electrical, or mechanical properties, such as reflectivity, electron emission, or Young's modulus.

Providing 450 a component that influences the nanowire provides to the respective NEM device influencing means including, but not limited to, one or more of a proof mass, an electrode, a charge source, a voltage source and other means for influencing the nanowire. Any one or more of these provided 450 components may be equivalent to a corresponding component that influences the nanowire described above for the various embodiments of the NEM device 100, 200, 300.

In some embodiments, providing 450 a component that influences the nanowire comprises forming a proof mass. In some embodiments, the formed proof mass is the proof mass 360 defined and described above for the NEM accelerometer device 300. As such, the formed proof mass is a portion of the targeted length of the grown 430 nanowire itself that, in some embodiments, further comprises a mass block suspended from a free end of the grown 430 nanowire. In some embodiments, the mass of the mass block is relatively greater than the mass of the grown 430 nanowire.

In some embodiment of forming a proof mass, the targeted length of the grown 430 nanowire inherently accounts for the end portion adjacent to the free end of the grown 430 nanowire as being the formed proof mass. In other embodiments, the nanowire is grown 430 for an additional time to form the end portion that is the proof mass adjacent to the free end. As such, the proof mass material is the material of the nanowire.

In other embodiments, the formed proof mass further comprises the mass block suspended from the free end of the nanowire, as mentioned above. The mass block material includes, but is not limited to, the semiconductor material of the layer or wafer and a metal. For some embodiments where the mass block is the semiconductor material of the layer or wafer, forming a proof mass further comprises forming an additional support block spaced from the support block that is provided during providing 420 a support block, as described above. Forming a proof mass further comprises growing 430 the nanowire from the support block until the free end impinges and connects to the additional support block. Further, forming a proof mass comprises releasing the additional support block from the substrate such that the mass block portion of the proof mass, according to these embodiments, is suspended.

In one example, an insulator layer between the additional support block and the wafer substrate is selectively etched away. One or both of a wet chemical etching technique and an isotropic dry etching technique may be used to etch away the insulator layer to release the additional support block from the substrate surface. The released support block becomes the mass block suspended at the free end of the nanowire. In some embodiments, the insulator layer is etched using an isotropic plasma etching technique.

In some embodiments, the mass block portion is rendered electrically conductive, for example using doping, as described above in providing 420 a support block, to facilitate capacitive monitoring of acceleration, for example. In some embodiments, the mass block is one or both of an inherently reflective material and coated with a reflective coating material, as described above to facilitate optical monitoring of acceleration.

As mentioned above, in some embodiments, the mass block is a block of metal material. In these embodiments, forming a proof mass further comprises selectively depositing a metal material on the nanoparticle catalyst at the free end of the grown 430 nanowire. In some embodiments, the metal is selectively deposited from a deposition solution comprising a salt of the metal material using electrochemical deposition. The metal will deposit on the free end of the nanowire to the exclusion of the other surfaces, such as surfaces having a native oxide formed thereon. For example, gold is deposited on a metal nanoparticle catalyst of gold to the exclusion of the nanowire and the support block using electroless deposition, when the nanowire and the support block are silicon having a native silicon oxide surface. The metal is selectively deposited until a targeted amount of the mass has accumulated on the free end of the nanowire. The selectively deposited metal is suspended from and supported by the grown 430 nanowire as the mass block portion of the proof mass, according to this embodiment.

In some embodiments, providing 450 a component that influences the nanowire comprises forming an electrode. The electrode is formed on the substrate in proximity to the nanowire. In some embodiments, the formed electrode is the control electrode 150 described above for the NEM light deflection device 100. In these embodiments, providing 450 a component comprises forming the electrode underneath where the nanowire extends. In other embodiments, the control electrode is formed to a side of where the nanowire extends. In some embodiments, the control electrode component is a region of the semiconductor wafer that is rendered electrically conductive using ion implantation through a patterned mask, for example. In other embodiments, the control electrode component is a metal pad or a polysilicon pad deposited on the electrically insulated substrate surface using evaporation or sputtering, for example. The polysilicon is rendered electrically conductive by doping. In other embodiments, the formed electrode is the first electrode 324a of the NEM accelerometer device 300 in FIG. 3C that is spaced from the proof mass 360. The processes described above for forming the control electrode are also applicable to forming the first electrode 324a illustrated in FIG. 3C, for example.

In other embodiments of providing 450 a component that influences the nanowire, wherein an electrode is formed as the component, the processes described above for providing 420 a support block that is further rendered electrically conductive are used. The provided 450 component in these embodiments are equivalent to one or more of the support electrodes 124 of the NEM light deflection device 100 in FIG. 1C; the electrode pair 224a, 224b of the NEM light generation device 200 in FIGS. 2A-2B; and the electrodes 324a, 324b of the NEM accelerometer device 300 in FIG. 3B, for example.

In some embodiments, providing 450 a component that influences the nanowire comprises providing a charge source in communication with the nanowire. In some embodiments, the charge source is provided 450 by electrically interfacing the charge source to one or both of the provided 420 support block(s), which are rendered electrically conductive as described above, and the provided 450 control electrode component. In some embodiments, the charge source component is equivalent to the charge source 160 described above for the NEM light deflection device 100. In these embodiments, the charge source 160 establishes a charge on the support electrode(s) 124 and the nanowire 130 and another charge on the control electrode 150, as illustrated in FIGS. 1A-1C. The charge source 160 creates a charge differential between the nanowire 130 and the control electrode 150 that influences the nanowire 130 to deflect from a stationary position.

In some embodiments, providing 450 a component that influences the nanowire comprises providing a voltage source in communication with the nanowire. In some embodiments, the voltage source is provided 450 by electrically interfacing the outputs of the voltages source to the provided 420 support blocks, which are rendered electrically conductive, as described above. In some embodiments, the voltage source component is equivalent to the voltage source 260 described above for the NEM light generation device 200. The voltage source component applies a voltage between the pair of electrodes 224a, 224b, as illustrated in FIGS. 2A-2B. The applied voltage on the nanowire 230 exceeds a breakdown voltage of the gap 226 between the nanowire 230 and the first electrode 224a, such that an electrical discharge bridges the gap and generates plasma in the gap 226.

As mentioned above, the NEM devices 100, 200, 300 have many applications. For example, one or both of the NEM light deflection device 100 and the NEM light generation device 200 may be used in display systems, communication systems and detection systems, to name a few. Such display systems include, but are not limited to, dash-board displays in vehicles, video displays, computer monitors, electronic billboards, and other solid state displays. The NEM accelerometer device 300 is used in systems that one or both of monitor and control acceleration. For example, such systems include, but are not limited to, air bags in vehicles, electronic stabilization control in vehicles, turbulence monitors in aircraft, inertial guidance systems, electronic games and computers.

Thus, there have been described various embodiments of NEM devices and a method of fabrication thereof. It should be understood that the above-described embodiments are merely illustrative of some of the many specific embodiments that represent the principles of the present invention. Clearly, other arrangements can be readily devised without departing from the scope of the present invention as defined by the following claims.

What is claimed is:

1. A nanoelectromechanical (NEM) device comprising:
a support block extending vertically from a horizontal surface of a substrate, the support block having a vertical side;
a nanowire extending laterally from the vertical side of the support block, the nanowire being spaced from the horizontal surface of the substrate; and
a component that influences the nanowire.

2. The NEM device of claim 1, further comprising a first electrode extending vertically from the horizontal substrate, the first electrode being adjacent to and spaced from a free end of the nanowire to provide a gap, wherein the support block comprises a second electrode, the first electrode and the second electrode being in electrical communication with the component that influences the nanowire.

3. The NEM device of claim 2, wherein the component that influences the nanowire comprises a voltage source connected between the first electrode and the second electrode, the component facilitating generation of plasma in the gap between the free end of the nanowire and the first electrode.

4. The NEM device of claim 2, further comprising a nanoparticle on the free end of the nanowire that facilitates plasma generation in the gap.

5. The NEM device of claim 2, further comprising means for enhancing a light output that is located in proximity to the gap.

6. The NEM device of claim 1, further comprising a control electrode in proximity to the nanowire, wherein the support block comprises a support electrode in electrical communication with the nanowire, the component that influences the nanowire being in communication with both the control electrode and the support electrode.

7. The NEM device of claim 6, wherein the component that influences the nanowire comprises a charge source connected to establish a charge on one or both of the control electrode and the support electrode, such that a charge differential created between the control electrode and the nanowire deflects the nanowire either toward or away from the control electrode.

8. The NEM device of claim 6, further comprising another support block, the nanowire bridging between the support blocks and being suspended above the substrate surface, the other support block comprising a support electrode in electrical communication with the nanowire.

9. The NEM device of claim 6, further comprising a reflective coating that is located in proximity to the nanowire.

10. The NEM device of claim 6, wherein the control electrode is located on the substrate either below the nanowire or to a side of the nanowire.

11. The NEM device of claim 1, wherein the component that influences the nanowire comprises a proof mass associated with an end portion of the nanowire that facilitates a response to acceleration.

12. The NEM device of claim 11, further comprising a first electrode adjacent to and spaced from the proof mass, the support block comprising a second electrode, a capacitance between the first electrode and the proof mass changing with movement of the proof mass due to the acceleration.

13. The NEM device of claim 12, wherein the first electrode either extends vertically from the horizontal substrate as another support block or is a conductive pad on the substrate surface.

14. The NEM device of claim 11, wherein movement of the proof mass due to the acceleration is detected one or both of capacitively and optically.

15. The NEM device of claim 11, wherein the proof mass reflects a light beam, such that movement of the proof mass due to the acceleration is detected optically by detecting a change in the reflected light beam.

16. The NEM device of claim 1, wherein the component that influences the nanowire comprises one or more of a voltage source in electrical communication with the nanowire, a charge source in electrical communication with the nanowire, an electrode in proximity to the nanowire and a proof mass associated with an end portion of the nanowire.

17. The NEM device of claim 1 used in a display, the display comprising:
   an array of pixels, a pixel comprising one or more of the NEM devices; and
   control electronics that address the pixels of the array either individually or in a variety of combinations of pixels, wherein the control electronics are in electrical communication with the component that influences the nanowire.

18. A nanoelectromechanical (NEM) device comprising:
   a support block extending vertically from a semiconductor substrate having a horizontal surface;
   a nanowire extending laterally from a vertical side of the support block, the nanowire being spaced from the horizontal surface of the semiconductor substrate; and
   means for influencing the nanowire, such that the nanowire facilitates one or more of light deflection, light generation, and an acceleration response.

19. A method of making a nanoelectromechanical (NEM) device comprising:
   providing a support block on a planar substrate having a horizontal surface;
   growing a nanowire from a vertical side of the support block using metal catalyzed growth, such that the nanowire grows laterally from the vertical side, the nanowire being spaced from the horizontal substrate surface; and providing a component that influences the nanowire.

20. The method of making of claim 19, wherein providing a component comprises providing one or more of a proof mass associated with an end portion of the nanowire, an electrode in proximity to the nanowire, a charge source in electrical communication with the nanowire, and a voltage source in electrical communication with the nanowire.

* * * * *